United States Patent
Barbier et al.

(10) Patent No.: US 6,996,139 B2
(45) Date of Patent: Feb. 7, 2006

(54) INTEGRATED-OPTICS COUPLING COMPONENT, DESIGNED TO ADAPT A LIGHT SOURCE TO A GUIDED OPTICS ELEMENT AND POWER LASER COMPRISING SAME

(75) Inventors: Denis Barbier, Grenoble (FR); Pierre Benech, Grenoble (FR)

(73) Assignee: Teem Photonics, Miniparc la Taillat (FR)

( * ) Notice: Subject to any disclaimer, the term of this patent is extended or adjusted under 35 U.S.C. 154(b) by 383 days.

(21) Appl. No.: 10/466,280

(22) PCT Filed: Feb. 18, 2002

(86) PCT No.: PCT/FR02/00609

§ 371 (c)(1),
(2), (4) Date: Jul. 15, 2003

(87) PCT Pub. No.: WO02/067028

PCT Pub. Date: Aug. 29, 2002

(65) Prior Publication Data

US 2004/0052288 A1   Mar. 18, 2004

(30) Foreign Application Priority Data

Feb. 19, 2001  (FR) .................................. 01 02223

(51) Int. Cl.
*H01S 3/098*   (2006.01)
*G02B 6/42*    (2006.01)
(52) U.S. Cl. ...................... 372/19; 372/50.1; 372/92; 385/42; 385/43; 385/45
(58) Field of Classification Search ................. 372/19, 372/50.1, 92, 108; 385/42, 43, 45
See application file for complete search history.

(56) References Cited

U.S. PATENT DOCUMENTS

| | | | | |
|---|---|---|---|---|
| 5,285,507 A | * | 2/1994 | Van der Tol | 385/11 |
| 5,513,196 A | * | 4/1996 | Bischel et al. | 372/22 |
| 5,799,119 A | * | 8/1998 | Rolland et al. | 385/28 |
| 6,236,784 B1 | * | 5/2001 | Ido | 385/45 |
| 6,542,670 B1 | * | 4/2003 | Takahashi et al. | 385/45 |

FOREIGN PATENT DOCUMENTS

EP   0 593 081 A2  *  4/1994

OTHER PUBLICATIONS

Lorenzo et al., "Method of Achieving Phase Delay With Wide Optical Bandwidth in Mulitmode Interference Devices," Optics Letters, vol. 23, No. 22 (Nov. 15, 1998) 1748-50.*

Duport et al., "New Integrated-Optics Interferometer in Planar Technology", Applied Optics, vol. 33 No. 25 (Sep. 1, 1994) 5954-58.*

* cited by examiner

Primary Examiner—James Menefee
(74) Attorney, Agent, or Firm—Oliff & Berridge, PLC

(57) ABSTRACT

The integrated-optics coupling component is designed to cooperate with a transverse multimode power laser diode (2) with semi-conductor to form a transverse multimode power laser. It comprises an input zone (4) connected to at least one output waveguide (6) by at least two adiabatic tapering zones (5). At least two filtering windows (7) form the inputs of the adiabatic tapering zones (5) at the end of a diffraction zone defined by the input zone. Reflecting elements, for example a Bragg grating (12), can be arranged on the output waveguide. An emitting face (3) being antiglare-treated, an extended laser cavity oscillating on a single predetermined mode is thus defined between a reflecting rear face (11) of the laser diode and the reflecting elements (12).

16 Claims, 5 Drawing Sheets

INTEGRATED-OPTICS COUPLING COMPONENT, DESIGNED TO ADAPT A LIGHT SOURCE TO A GUIDED OPTICS ELEMENT AND POWER LASER COMPRISING SAME

BACKGROUND OF THE INVENTION

The invention relates to an integrated-optics coupling component achieved from an optics substrate in which waveguides are formed.

STATE OF THE ART

In optics telecommunications, optic amplifiers are often used. Conventionally, the amplifying function is achieved by simultaneous injection, into an optic fiber or an integrated-optics waveguide, of an optic signal to be amplified, of power Pi (input power) and wavelength λs, and a pump signal of power Pp (pump power) and wavelength λp. An amplified optic signal is thus obtained, of power (output power) Po=GPi, G being the gain of the optic amplifier. The higher the pump power, the higher the gain G. The pump power is typically comprised between 100 and 1000 mW in current optic amplifiers having a wavelength λs of about 1.55 µm and using silica or glass, for example doped with rare earth ions.

Such pump powers can only currently be supplied by semi-conductor pump laser diodes of transverse multimode type.

Known pump diodes are formed either by single-stripe diodes of large width, i.e. typically with a width of about a hundred micrometers, or by multi-stripe diodes. These types of laser diodes emit on an often large number of modes of different spatial directions.

However, optic fibers or optic waveguides designed to perform propagation of the optic signal to be amplified and of the pump signal are generally structures that are monomode or have a limited number of modes. There is consequently a large difference in the spatial amplitude distribution emitted by the power laser diode used as a pump diode and the amplitude distribution of the mode able to propagate in an integrated optic guide or in an optic fiber. This poor matching results in practice in low power injection efficiencies from the laser diode towards the amplifying structure. To obtain a given amplification gain, it is then necessary to oversize the power of the pump laser diode, which increases the cost of the laser diode and its electrical consumption in operation. Inversely, for a predetermined pump power, the amplification gains that can be obtained are relatively low.

U.S. Pat. No. 5,513,196 discloses a structure coupled to a laser diode selecting fundamental transverse mode and designed to perform frequency selection.

OBJECT OF THE INVENTION

The object of the invention is to remedy the shortcomings of known devices and to supply a coupling component enabling in particular the best possible advantage to be taken, with a good stability of emission, from the power emitted by a power laser diode used in particular in optic amplifiers.

According to the invention, this object is achieved by a coupling component according to the appended claims.

The coupling component according to the invention is an integrated-optics component, designed to adapt a light source to a guided optics element and comprises an optics substrate, wherein waveguides are formed, and successively an input guide zone arranged facing the source, an output zone comprising at least one, monomode, output waveguide narrower than the input guide zone, and filtering means comprising at least one adiabatic tapering zone connecting the input guide zone and the output zone. It is characterized in that the input guide zone defines a diffraction zone of predetermined length between the input of the component and an observation plane, at least two filtering windows arranged at predetermined locations of the observation plane, constituting the inputs of the adiabatic tapering zones, so as to guide a light wave from the source to the output zone selecting one of the modes of said wave.

In a preferred embodiment, L being the width of the illuminated input guide zone and λ the wavelength of the light emitted by the light source, the length of the diffraction zone is greater than or equal to $L^2/4\lambda$ and preferably greater than or equal to 2.5 mm.

According to a development of the invention, reflecting means are associated with the output waveguide and the component is designed to cooperate with a transverse multimode light source comprising a reflecting rear face and an emitting face to form a transverse monomode power laser, the emitting face of the light source being treated so as to form an antiglare external face, so as to define an extended laser cavity oscillating on a single predetermined mode between said rear face and the reflecting means.

The reflecting means can comprise a Bragg grating, a reflecting layer arranged at an output end of the output zone or a closed loop at the output end of the output waveguide, associated with at least one coupler enabling a fraction of the light generated to be tapped off.

The invention also relates to a monomode power laser comprising a multimode laser diode comprising an internal laser cavity bounded by a reflecting rear face and an emitting face, comprising a coupling component according to the invention, the emitting face of the laser diode being treated so as to form an antiglare external face, so as to define an extended laser cavity between said rear face and reflecting means.

BRIEF DESCRIPTION OF THE DRAWINGS

Other advantages and features will become more clearly apparent from the following description of particular embodiments of the invention given as nonrestrictive examples only and represented in the accompanying drawings in which.

DESCRIPTION OF PARTICULAR EMBODIMENTS

The coupling component according to the invention is achieved in integrated optics. It is made from an optics substrate 1 wherein waveguides are formed, and is designed to cooperate with a light source such as for example a transverse multimode power laser diode 2 with semi-conductor. It enables the source 2 to be adapted to a guided optics element, not represented, such as for example an optic fiber, or a guided optics amplifier or any component requiring use of a monomode wave source preferably a high-power source.

Figure 3:
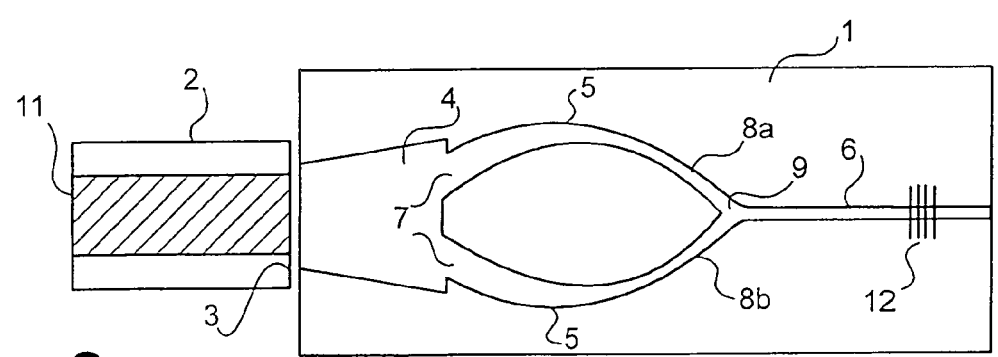
Figure 4:
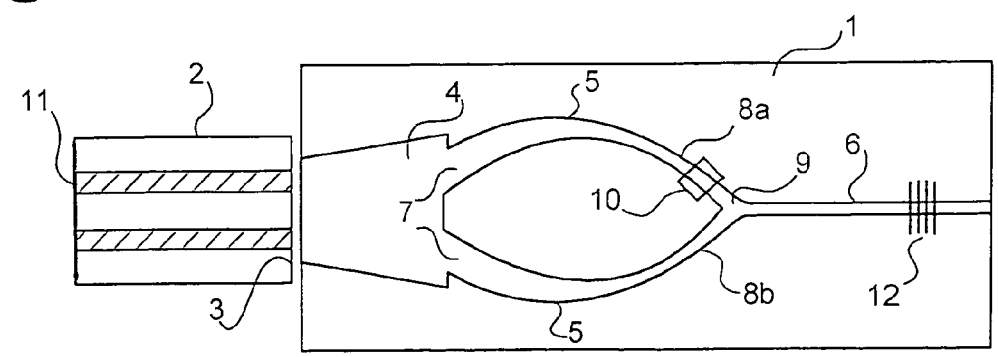
Figure 5:
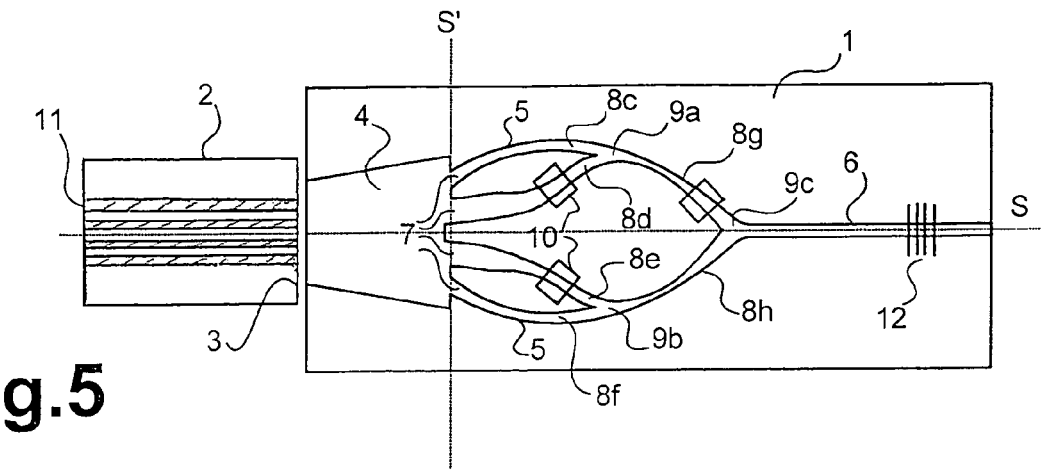
Figure 8:
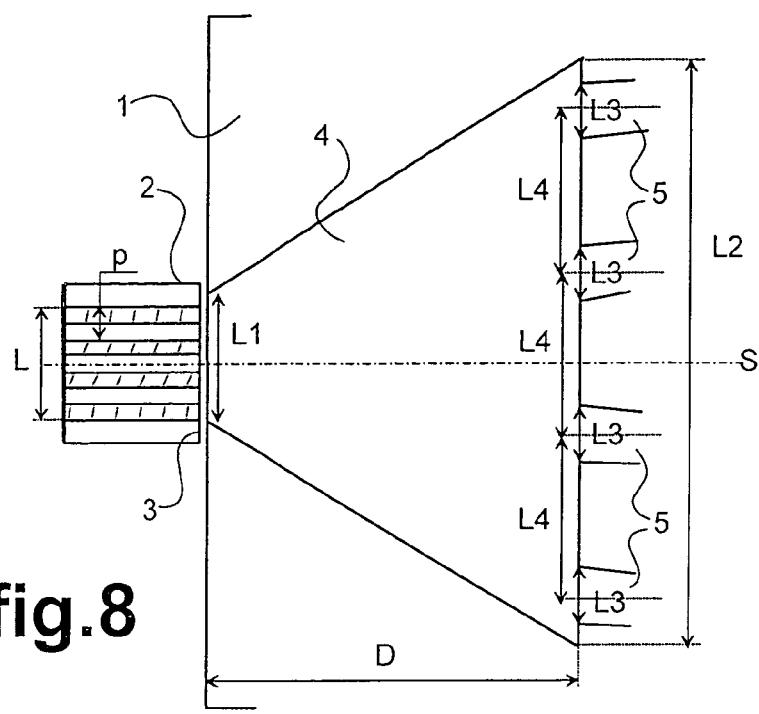

The laser diode 2 can be a broad single-stripe laser diode (FIGS. 1 to 3) or a multi-stripe laser diode (FIGS. 4, 5 and 8). Broadening of the stripe in a single-stripe laser diode or the use of a plurality of narrow stripes in a multi-stripe laser diode enables the light power emitted to be increased. Coupling between the narrow stripes, which are monomode, in a multi-stripe laser diode causes emission of a multitude of transverse modes, as in a broad single-stripe laser diode. For example, a laser diode with a stripe of width L=100 $\mu$m (FIG. 6) can emit on about 200 transverse modes. In both cases, the emission characteristics of the power laser diode are hardly compatible with light injection into a waveguide or a monomode optic fiber.

In FIGS. 1 to 8 and 16, the diode 2 and coupling component are represented in top view, parallel to a plane in which the diode semi-conductor junction is made. A longitudinal axis of symmetry S of the laser diode 2 and of the coupling component, parallel to the direction of light propagation at the output of the laser diode 2, is represented in FIGS. 5 to 8. The laser diode 2 comprises an emitting face 3 perpendicular to the plane of the figures.

At the output of the laser diode 2, in a plane parallel to the emitting face 3, it can be considered that the amplitude distribution of the transverse fundamental mode and of the first harmonics of the light wave emitted by the laser diode is very confined, typically about 1 $\mu$m wide, along a first axis perpendicular to the plane of FIGS. 1 to 8. Coupling thereof with a monomode optic guide, whose profile is almost symmetrical and of a width conventionally comprised between 6 and 10 $\mu$m along the first axis, does not cause any problem. For a broad single-stripe laser diode however, the amplitude distributions of the different transverse modes along a second axis S' (FIG. 5), perpendicular to the axis S in the plane of FIGS. 1 to 8, are formed by substantially sinusoidal functions within the stripe, which constitutes a guide zone, and of decreasing exponential type, more extended the higher the harmonics number, outside the stripe. Likewise, for a multi-stripe laser diode, the amplitude distributions along the second axis are of exponential type. In both cases, coupling with a monomode optic guide whose profile is almost symmetrical and whose width is conventionally comprised between 6 and 10 $\mu$m along the second axis S', would not be very efficient at all.

It can be shown that the different transverse modes emitted by the two types of laser diodes 2 considered form, at the output of the laser diode 2, at a distance D (FIGS. 6 to 8) from the input of the component, diffraction figures of interference fringe type whose light intensity along the second axis S' perpendicular to the axis S in the plane of FIGS. 1 to 8, presents lobes, or light peaks. The width of the lobes is predetermined and is a function of the wavelength of the light emitted by the laser diode, of the distance D between the input face of the coupling component 1 and the observation plane and of the width of the illuminated guide zone on input, i.e. the width L of the stripe in the case of a single-stripe diode or of the complete multi-stripe arrangement (FIG. 8). For a single-stripe laser diode, a particular transverse mode leads to a diffraction figure composed of two separate lobes that can be superposed to form a single lobe corresponding to fundamental mode in the case where excitation of the latter is privileged. In the case of a multi-stripe laser diode, at least two separate lobes are observed. In practice, the amplitude of the lobes decreases quickly and no more than four lobes of notable amplitude are observed, i.e. two lobes for a multi-stripe laser diode with a high coupling coefficient between the stripes and four lobes for a multi-stripe laser diode with a low coupling coefficient between the stripes.

Figure 1:
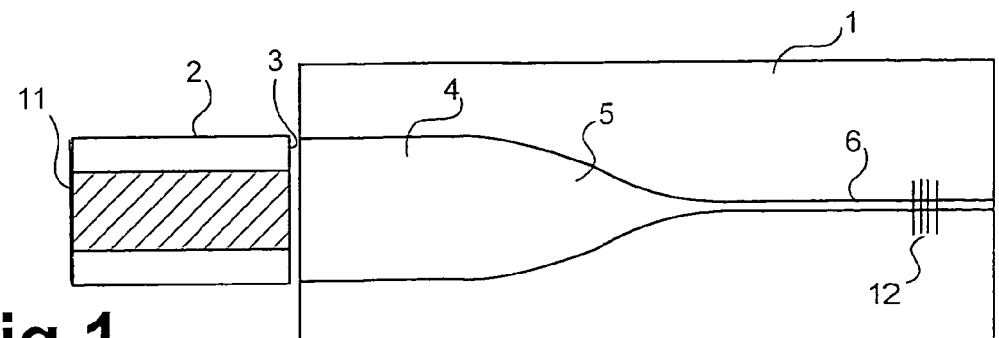
FIGS. 1 to 5 represent different embodiments of a coupling component.
Figure 2:
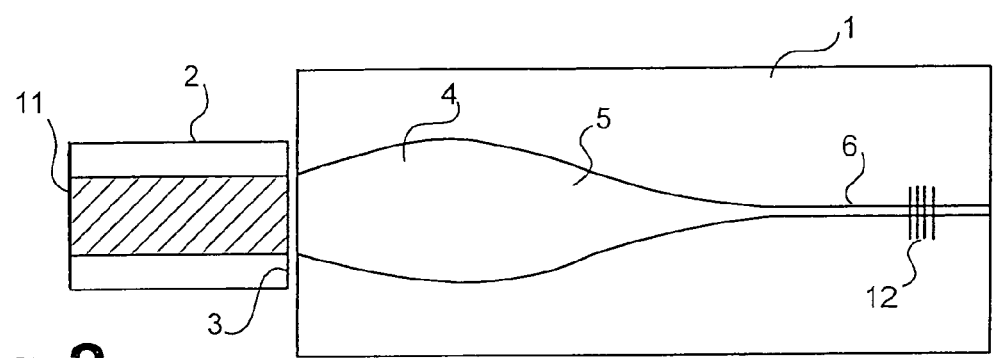
Figure 6:
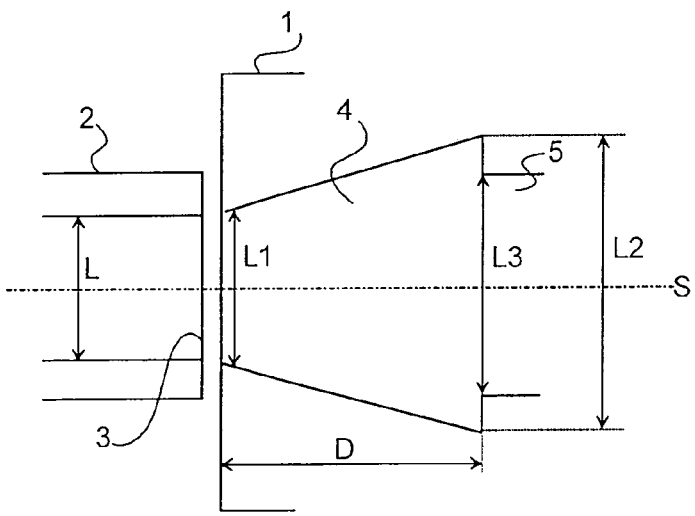
FIGS. 6 to 8 represent, in schematic form, the input structure of a coupling component respectively with one, two and four diffraction lobes.

FIGS. 1, 2 and 6 concern, for example purposes, a coupling component associated with a broad single-stripe laser diode excited in fundamental mode. This produces a diffraction figure with a single lobe in an observation plane parallel to the emitting face 3 of the laser diode 2 and situated, along the axis S, at a distance at least equal to D (FIG. 6) from the input of the coupling component.

Figure 7:
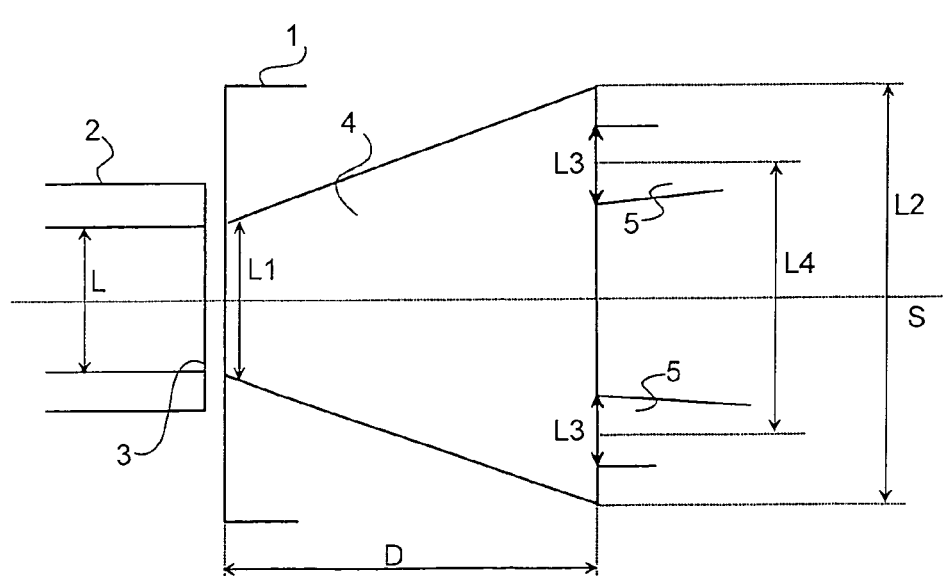

FIGS. 3, 4 and 7 concern a coupling component associated with a broad single-stripe or multi-stripe laser diode 2 with a high coupling coefficient, producing a diffraction figure with two lobes at a distance at least equal to D.

FIGS. 5 and 8 concern a coupling component associated with a multi-stripe laser diode 2 with low coupling between the stripes, producing a diffraction figure with four significant lobes at a distance at least equal to D.

All the coupling components described comprise an input guide zone 4 comprising a waveguide having spatial characteristics designed to ensure optimum injection of the light emitted by the laser diode 2 into the coupling component. The input guide zone 4 has an input width $L_1$ along the second axis, perpendicular to the axis S in the plane of FIGS. 1 to 8. The input width $L_1$ is greater than the width L of the stripe or of the multi-stripe set of the laser diode 2. The input guide zone extends, along the axis S, over a distance at least equal to D from the input of the coupling component, which faces the emitting face 3 of the laser diode 2. The width of the input guide zone can remain constant (FIG. 1) or widen (FIGS. 2 to 8) over the distance D up to an output width $L_2$ in order to optimize the light propagation conditions in this zone and minimize losses.

The input guide zone 4 also forms a diffraction zone of length D designed to enable planar diffraction of the light injected into the coupling component. In the particular case of the broad single-stripe laser emitting in fundamental mode and only producing a single lobe, the particular propagation conditions mean that the distance D can be chosen close to zero. In practice, the input guide zone must always have a minimum length of a few millimeters, along the axis S, to perform its coupling function with the laser diode. The distance D is greater than or equal to 2.5 mm, preferably comprised between 10 and 25 mm.

As represented in FIGS. 1 to 5, the coupling component comprises, down-line from the input guide zone 4, filtering means presenting at least one intermediate waveguide comprising an adiabatic tapering zone 5. The adiabatic tapering zone 5 is designed to ensure optimum adaptation, with a minimum of propagation losses, between the input guide zone 4 and an output zone of the coupling component comprising at least one output waveguide 6, advantageously a transverse monomode waveguide, preferably in integrated optics.

In the particular embodiments of FIGS. 1 and 2, with a single diffraction lobe, the adiabatic tapering zone 5 extends the waveguide forming the input guide zone 4. It tapers in regular manner up to the dimensions of a monomode waveguide 6, conventionally having a diameter comprised between 5 and 10 μm.

According to the invention, at least two filtering windows 7 are arranged at predetermined locations of the observation plane, constituting the inputs of the adiabatic tapering zones 5. In the particular embodiments of FIGS. 3 to 5, respectively with 2 or 4 diffraction lobes, the coupling component respectively comprises 2 or 4 intermediate guides with adiabatic tapering zones 5. Each adiabatic tapering zone 5 connects a filtering window 7 of width $L_3$ along the above-mentioned second axis (FIGS. 6 to 8), by means of a waveguide the width whereof decreases regularly, to a connecting waveguide which is preferably a transverse monomode waveguide 8a, 8b (FIGS. 3 and 4), 8c, 8d, 8e or 8f (FIG. 5). The filtering windows 7 situated in the above-mentioned observation plane at the distance D from the input face of the component are designed to select the diffraction lobes formed in this plane and to inject them into the associated adiabatic tapering zones 5.

A filtering window 7 is designed to favor a particular transverse light propagation mode, i.e. to select particular transverse modes. The filtering windows 7 are achieved very simply, in integrated optics in the coupling component, at the same time as the input zones, the adiabatic tapering zones and the output zones. The coupling component uses therefor the amplitude distribution of the diffraction figure at the distance D from the input face of the component. The filtering windows 7 constitute, in the above-mentioned observation plane, input openings of the adiabatic tapering zones 5, only letting the portions of light of the diffraction figure situated at the selected locations pass.

When there is only one diffraction lobe, the width $L_3$ of the filtering window corresponding to the width of the diffraction lobe, is preferably equal to the output width $L_2$ of the input zone (FIGS. 1 and 2). It can however be smaller than the latter width, as represented in FIG. 6. When there are 2 or 4 diffraction lobes, the distance between the lobes along the above-mentioned second axis is predetermined according to the wavelength of the light emitted by the laser diode 2, the distance D, the width of the emission zone (single stripe or multi-stripe) for the transverse mode considered and the order of the transverse mode considered. The filtering windows have dimensions (width $L_3$) and positions (separating distance $L_4$) chosen so as to only let the selected transverse mode pass, the light intensity of which mode is maximum at the location of the center of the associated filtering window.

The length D of the diffraction zone is calculated in such a way that the diffraction phenomenon, at the end of the diffraction zone where the filtering windows 7 are placed, can be considered as the Fourier transform of the amplitude distribution of light at the input of the diffraction zone. This implies the following relation:

$$L^2/4D \leq \lambda/10 \text{ i.e. } D \geq 10 L_2/4\lambda$$

wherein L is the width of the illuminated input zone and λ the wavelength of the light emitted by the light source. For example, for L=100 μm and λ=0.98 μm, we obtain D≧25 mm.

In practice, there is little difference between the diffraction amplitude distribution and the required Fourier transform provided that the following relation is fulfilled:

$$L^2/4D \leq \lambda \text{ i.e. } D \geq L^2/4\lambda$$

In the example above, we thus obtain D≧2.5 mm.

The respective dimensions of the different zones are, for example, the following, for a wavelength λ=1.55 μm, a width L=100 μm and an input width L1≧100 μm:

For one diffraction lobe (FIGS. 1, 2 and 6):
  for D=10 mm, L2≈L3≈300 μm
  for D=20 mm, L2≈L3≈500 to 600 μm For two diffraction lobes (FIGS. 3, 4 and 7), that is to say, for example, in the case of a broad single-stripe laser diode in which the 6th transverse mode is privileged or in a multi-stripe laser diode having a pitch p of 17 μm between the stripes and emitting beams of about 12 μm in diameter emitted by each of the stripes:
  for D=10 mm, L2≈800 to 900 μm, L3≈200 μm and L4≈600 μm
  for D=20 mm, L2≈1.6 to 1.8 mm, L3≈400 μm and L4≈1.2 mm For four diffraction lobes (FIGS. 5 and 8), that is to say, for example, for a multi-stripe laser diode with low coupling having a pitch p of 17 μm between the stripes and beams of about 6 μm in diameter emitted by each of the stripes:
  for D=10 mm, L3≈2λD/L≈200 μm and L4≈λD/p≈600 μm
  for D=20 mm, L3≈400 μm and L4≈1.2 mm Using several filtering windows 7 makes it possible to select modes of the laser diode 2 higher than fundamental mode which is selected when there is a single window. This higher order mode selection enables a better stability of emission of the laser diode to be achieved in so far as the high order modes have an intensity distribution composed of several lobes which involves a better smoothing of electric pumping in the laser diode. It is in particular possible to favor lobes whose distance between emission lobes is about the diffusion length Df of the carriers in the laser diode material, i.e. typically a few micrometers. This selection leads to a more stable emission while reducing the competition between the laser modules. The use of a transverse harmonic mode with a rather large number of lobes does in fact enable the intensity emitted to be better distributed over the whole width of the stripe, while using electric pumping of the diode to the best. For example, a transverse mode comprised between the numbers 25 and 50 can be privileged, typically with a diffusion length Df of about 2 μm.

In all the embodiments represented, the axis S constitutes an axis of symmetry for the laser diode 2, the input zone 4 and the filtering windows 7.

In the coupling components comprising at least two filtering windows 7 (FIGS. 3 to 5), the adiabatic tapering zones 5 are arranged symmetrically on each side of the axis S and are, at their origin, inclined with respect to the axis S so as to move away from it.

In the output zone of the coupling component, Y-junctions of conventional type enable the intermediate waveguides to be grouped two by two to terminate in the output monomode waveguide 6. In the particular embodiments of FIGS. 3 and 4, a single Y-junction 9, symmetrical with respect to the axis S, connects the connecting waveguides 8a and 8b to the output waveguide 6. In the particular embodiment of FIG. 5, with four filtering windows 7 and four adiabatic tapering zones 5, a cascade of Y-junctions is necessary. Thus, in FIG. 5, a dissymmetric Y-junction 9a connects two connecting waveguides 8c and 8d arranged on output of two adiabatic tapering zones 5, both located on one side of the axis S, to a connecting waveguide 8g. Likewise, a dissymmetric Y-junction 9b connects two other connecting waveguides 8e and 8f, arranged on the other side of the axis S, to another connecting waveguide 8h. A third symmetric Y-junction 9c, arranged in cascade with the Y-junctions 9a and 9b, connects the connecting waveguides 8g and 8h to the output waveguide 6.

In coupling components comprising connecting waveguides, phase shifters 10 can in conventional manner be situated on one of the connecting guides (8a in FIG. 4, 8d, 8e and 8g in FIG. 5) to take up any possible geometric phase shifts between the input guides of the Y-junctions so as to ensure phasing of the optic signals input to the Y-junctions and optimum collection on the output guide of the Y-junction concerned. In conventional manner, the phase shifts that may be necessary can be adjusted by localized heating of the waveguide considered. This can be achieved notably by laser micro-heating, by proximity heating by a heating microelement or by means of heating electrodes placed above the waveguide.

The Y-junctions can be replaced by directional couplers if desired. In this case, the two inputs of the coupler are preferably in phase quadrature to collect two input optic waves on a single waveguide. The phase shifters 10 are then arranged accordingly.

The coupling component described above can present too large power losses. To remedy this, it is associated with means for amplifying a wave mode of the light emitted by the light source. According to a preferred embodiment, reflecting elements, or feedback elements, associated with the output zone, perform feedback of a part of the light transported by the output waveguide 6 in the direction of the laser diode 2. The feedback elements must have a high reflection coefficient, but less than 1, to enable the required power to be obtained on output of the coupling component. Due to these feedback elements, the coupling component can form, with the transverse monomode laser diode 2, a transverse monomode power laser with extended laser cavity, oscillating on the transverse mode selected by the coupling component and supplying an optimum light power at the output of the output monomode waveguide 6. The laser diode 2 conventionally comprises an internal laser cavity bounded by a reflecting rear face 11 and by the emitting face 3. The normally reflecting emitting face 3 is treated so as to form an antiglare external face or covered by an antiglare layer, so as to reduce the amount of light reflected by the emitting face 3 to the minimum, prevent any oscillation in the internal laser cavity of the laser diode 2 and privilege laser oscillation in an extended laser cavity bounded on the one hand by the reflecting rear face 11 of the laser diode 2 and on the other hand by the feedback elements arranged in the output zone of the coupling component. An antiglare layer can be deposited on the input face of the coupling component if desired. It is however not indispensable on account of the low natural reflection coefficient of the coupling component. Antiglare treatment of the rear face is on the other hand indispensable on account of the high refractive index of the semi-conductor materials used in laser diodes.

According to a preferred embodiment illustrated in FIGS. 1 to 5 and 9, the feedback elements are formed by a Bragg grating 12 (diffraction grating) arranged on the output waveguide 6. It could be arranged outside the coupling component on a waveguide connected to the output waveguide 6. The Bragg grating performs both the required reflection and a wavelength selection function. This enables for example the spectral bandwidth of the laser emission in the extended laser cavity to be tuned to the optimum pumping spectral bandwidth of an optic amplifier.

With a high-coupling Bragg grating comprising a small number of lines for a predetermined reflection coefficient, the wavelength selectivity is low and the extended laser cavity oscillates over a relatively broad spectrum. With a low-coupling Bragg grating on the other hand, comprising a large number of lines for a predetermined reflection coefficient, the wavelength selectivity is high and the extended laser cavity oscillates over a narrow spectrum. The choice of the coupling coefficient and of the number of lines of the Bragg grating enables the reflection coefficient and the width of the emitted spectrum to be adjusted in known manner, which can thus be optimized to ensure an optimum pumping efficiency of an optic amplifier.

The Bragg grating can be achieved in any known manner, for example by dry etching, by wet etching (chemical etching), by photoinscription, by localized ion diffusion through a mask, etc.

Figure 9:
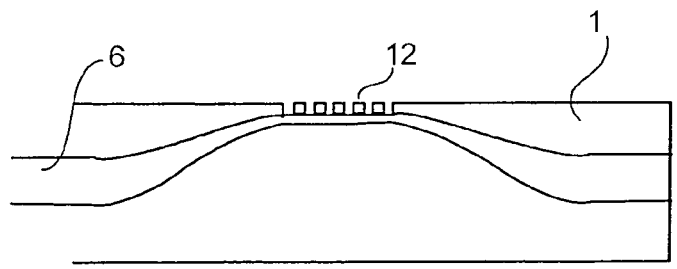
FIGS. 9 to 11 illustrate in greater detail particular embodiments of the reflecting elements of a coupling component according to the invention.

Etched Bragg gratings generally enable high coupling coefficients to be obtained. To enhance the coupling coefficient, in the case where the output waveguide 6 is achieved by ion exchange in a glass substrate, it is possible to use a surface guide with large confinement. This known technique is illustrated in FIG. 9, which represents, in side view, a particular embodiment of an end of the output zone of a coupling component. The output waveguide 6 comprises, on input, in the left part of FIG. 9, a buried first part with small confinement. The waveguide 6 then comprises, in localized manner facing the Bragg grating 12 etched at the surface of the substrate 1, a narrower second part with large confinement, flush with the substrate surface. The waveguide 6 then comprises, on output, in the right part of FIG. 9, a buried third part with small confinement designed to be coupled, at the output of the coupling component, to an optics element such as an integrated optics waveguide or an optic fiber. The output waveguide 6 presents dimensions and a depth that vary regularly between the first and second part and between the second and third part. This type of arrangement results both in an increase of the coupling coefficient with the Bragg grating 12 obtained due to the use of a surface guide with a large confinement, and in easy connection of the coupling component with an optics waveguide or an optic fiber due to the use of a buried waveguide with a small confinement in the first and third parts of the output waveguide 6.

If the coupling coefficient with the Bragg grating 12 doesn't need to be high, the output waveguide 6 can be formed by a guide with low confinement in the coupling zone.

The Bragg grating 12 can be arranged perpendicularly to the axis S of light propagation in the output waveguide 6, as represented in FIGS. 1 to 5, or be inclined with respect to this axis by an angle different from 90°. A constant-pitch or variable-pitch Bragg grating 12 can be used.

Figure 10:
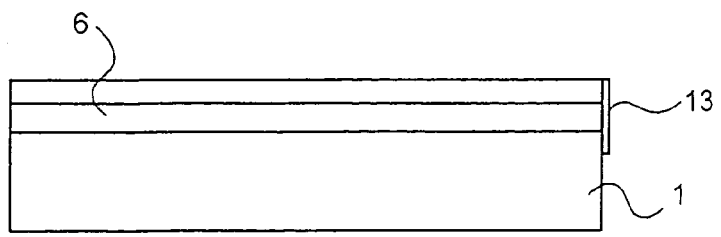

Another embodiment of the feedback elements is illustrated in FIG. 10, which represents, in side view, a particular embodiment of an end of the output zone of a coupling component. In this embodiment, a reflecting element 13 is arranged at the output end of the coupling component (on the right in FIG. 10). The reflecting element must have a high reflectivity, but less than 1, and a low transmission. It can be wavelength-selective. It is preferably formed by a metallic deposit or by a reflecting multi-layer deposit, constituting a mirror, dichroic or not, on the output face of the coupling component, at the output end of the output waveguide 6. For a good mode selection, it can comprise a spectral filter stuck onto the reflecting layer.

Figure 11:
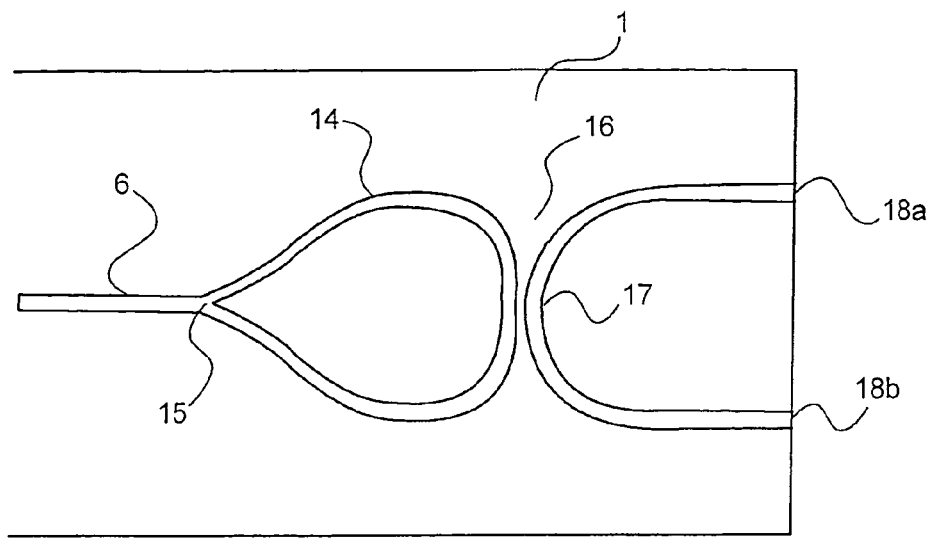

A third embodiment of the feedback elements is illustrated in FIG. 11, which represents, in top view, a particular embodiment of an end of the output zone of a coupling component. In this embodiment, the output waveguide 6 presents at its output end a closed loop 14 ensuring feedback of the light guided by the output waveguide 6 by means of a Y-junction 15.

Extraction of a part of the light guided in the loop 14 is performed by a directional coupler 16. In FIG. 11, the directional coupler is formed by the loop 14 and a waveguide 17, made in the substrate 1, comprising a coupling part near to a part of the loop 14 and two symmetrical outputs 18a and 18b. Two light beams are thus obtained in this case on output from the coupling component.

Figure 12:
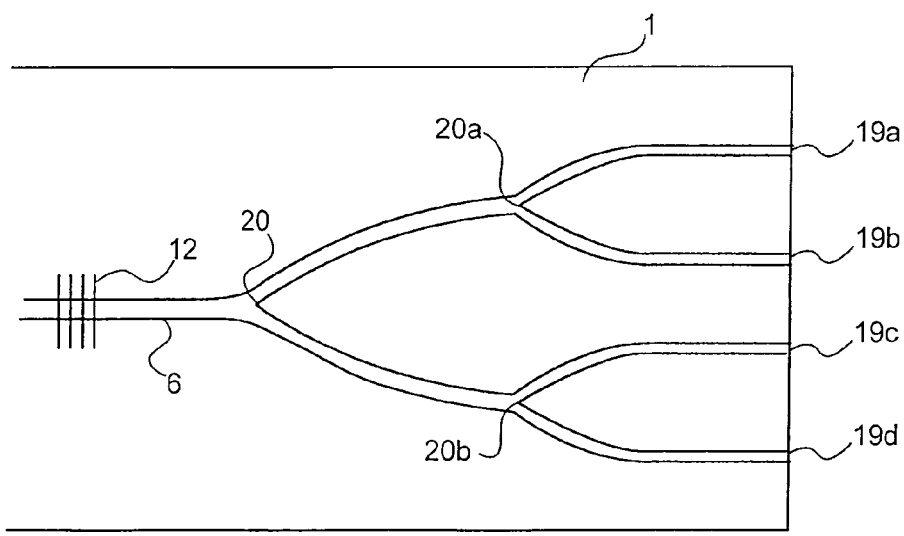
FIG. 12 represents in greater detail a particular embodiment of an end of the output zone of a coupling component according to the invention.

More generally, several light beams can be generated on output from the coupling component, from an output waveguide 6. A particular mode of an end of the output zone of a coupling component, represented in FIG. 12 in top view, comprises 4 outputs 19a, 19b, 19c and 19d, obtained by means of a cascade of Y-junctions 20 then 20a and 20b arranged downstream from the Bragg grating 12. The even number of outputs available depends on the number of Y-junctions arranged in series. Pump signals can thus be supplied to several optic amplifiers from a single power laser diode, in so far as the coupling component according to the invention enables high output powers to be generated. Sub-division of the output waveguide 6 being performed downstream from the feedback elements (Bragg grating in FIG. 11), a single feedback element can be used for all the outputs.

The laser diode 2 and coupling component are preferably coupled in butt coupling manner, the emitting face 3 of the laser diode being placed facing the input-zone of the coupling component (FIGS. 1 to 8 and 13 to 15). This enables a very compact monomode power laser with extended cavity to be obtained. It is preferable to minimize the coupling losses between the laser diode 2 and the coupling component. The dimensions of the different elements described with reference to FIGS. 1 to 8 take account of this necessity in the plane of FIGS. 1 to 8. On the other hand, in a plane perpendicular to the plane of FIGS. 1 to 8, i.e. parallel to the emitting face 3, there is in general a large difference of confinement between the emitting structure of the laser diode 2 which supplies a very spatially confined (typically about 1 $\mu$m wide), and therefore very divergent, beam, and the input structure of the coupling component which presents a medium or low confinement. Even if the distance between the laser diode 2 and the coupling component is minimized to a few microns, the overlap of the profiles of the guided modes of the laser diode and coupling component is not necessarily optimal. This may lead to high insertion losses in the extended cavity.

To minimize this type of losses, the input zone of the coupling component is preferably formed by an input waveguide structure with very large confinement, with a mode profile along the above-mentioned first axis (vertical axis) of dimensions close to that of the laser diode, i.e. about a micron.

Figure 13:
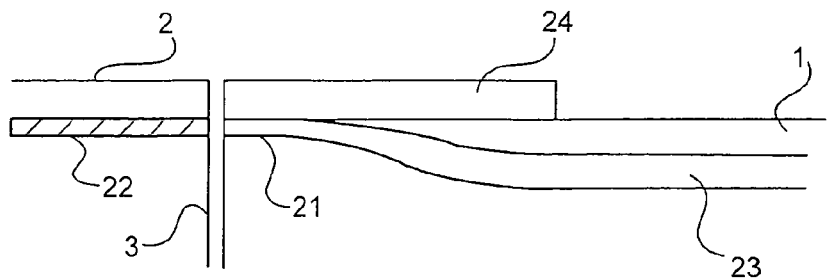
FIGS. 13 to 15 represent in greater detail particular embodiments of coupling between a laser diode and a coupling component according to the invention.

FIG. 13 illustrates, in side view, a particular embodiment of the diode-component coupling presenting the required characteristics. The input zone of the coupling component comprises on input a waveguide 21 with large confinement, in the direction perpendicular to the plane of the substrate, presenting a high index variation, at the surface or buried at a very small depth in the optics substrate 1. As represented in FIG. 13, the thin waveguide 21 is arranged facing the emitting part 22 of the laser diode 2 formed by the semi-conducting junction of the latter. However, high-confinement waveguides, in particular achieved by ion exchange in glasses, present higher propagation losses than buried guides with low confinement, and it is therefore not desirable to use them on the whole of the optic component. In FIG. 13, the high-confinement waveguide 21 is localized at the input end of the input zone and extended by a thicker, buried, low-confinement waveguide 23. A symmetrization layer 24 is preferably deposited on the substrate 1 to obtain a guided mode profile as close as possible to that of the laser diode along an axis perpendicular to the semi-conducting junction of the laser diode. The symmetrization layer has a refractive index equal to or lower than that of the substrate 1. It can be made of silica, for example if the substrate 1 is made of glass.

This embodiment improves injection into the coupling component of light coming from the laser diode 2. It does not however enable coupling to be totally optimized, for the waveguide 21, obtained by ion exchange in the substrate 1, nevertheless leads to less confined modes than those emitted by the laser diode in the direction of the above-mentioned first axis (vertical axis), perpendicularly to the laser diode junction.

Figure 14:
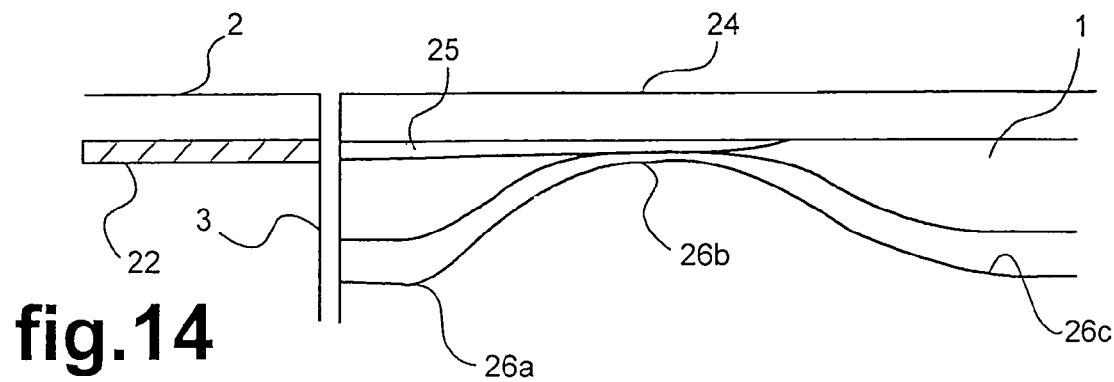
Figure 15:
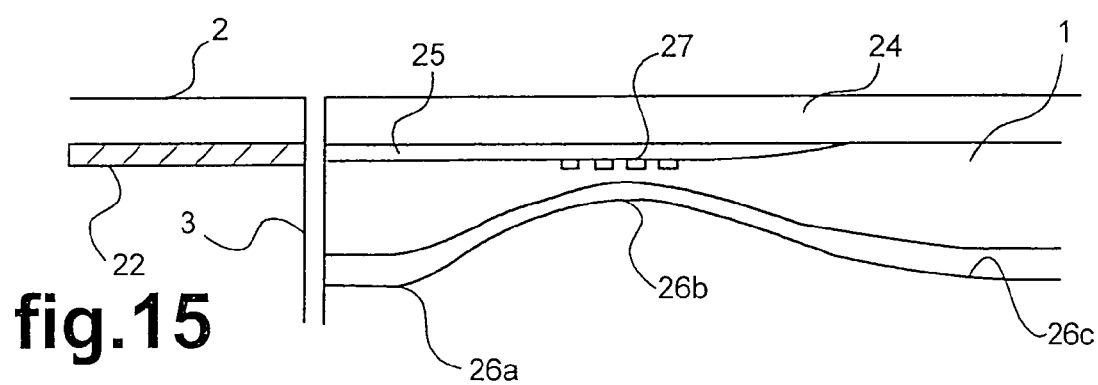

The particular embodiments of the diode-component coupling illustrated, in side view, in FIGS. 14 and 15 enable the mode structures of the laser diode 2 to be approached and thus enable coupling along the first axis to be further improved.

In FIGS. 14 and 15, a waveguide 25, with large confinement in the direction perpendicular to the plane of the substrate, is formed at the surface of the optics substrate 1. The waveguide 25 is superposed on a second waveguide achieved by ion exchange in the substrate 1 and comprising, in a similar manner to the guide 6 of FIG. 9, possibly a thick, buried, first part 26a with low confinement extended at the surface by a second, thinner, coupling part 25b, with high confinement, itself extended by a third part 26c with low confinement similar to the first part 26a. The waveguide 25 can be achieved by deposition of a thin dielectric layer (about 0.1 $\mu$m for example), of high index on the surface of the optics substrate 1. For example, it can be made of silicon nitride, with an index 1.97, or alumina deposited by Plasma Enhanced Chemical Vapor Deposition (PECVD) or by cathode sputtering.

The waveguide 25 constitutes the input of the input zone 4 and is coupled to the second waveguide, the third part 26c whereof constitutes the output of the input zone. Coupling between the superposed waveguides, or more precisely between the waveguide 25 and the second, coupling, part 26b of the second waveguide, can be achieved either by a smooth transition obtained by a regular decrease of the thickness of the high index layer constituting the guide 25 (FIG. 14) or by means of a Bragg grating 27 made at the surface of the substrate 1 at the level of the second part 26b (FIG. 15). In this case, the pitch of the Bragg grating 27 is calculated so as to adapt the propagation constants of the propagation modes of the waveguide 25 and of the part 26b. If this solution is chosen, it can be achieved in the same technological cycle as the Bragg grating illustrated in FIG. 9.

As in FIG. 13, a symmetrization layer 24, of index close to or lower than that of the optics substrate 1, is preferably deposited on the substrate.

Figure 16:
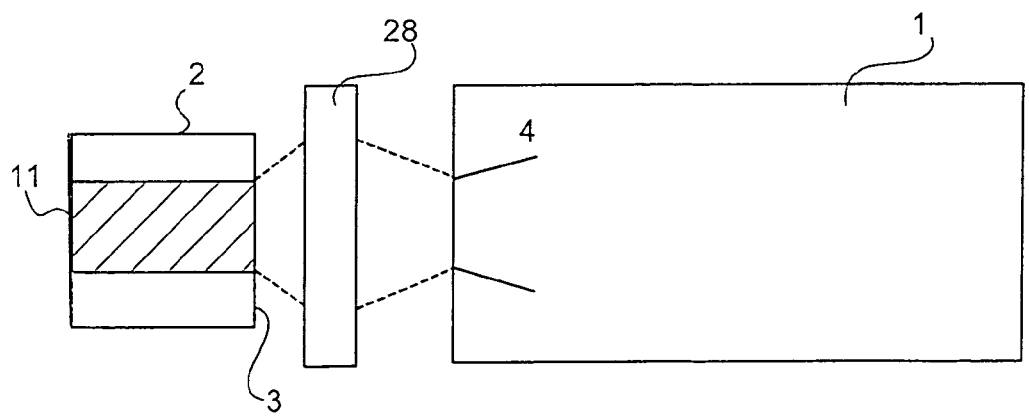
FIG. 16 illustrates coupling of a laser source and a coupling component according to the invention via an optic adapting element.

Coupling between the laser diode 2 and the coupling component can also be achieved by means of external optic adapting elements 28, as represented in top view in FIG. 16. It is then in general not necessary to use the mode profile adapting structures along the first axis described above, the optic adapting elements 28 being dimensioned in suitable manner for transfer of the mode profiles from the laser diode 2 to the coupling component. This solution is nevertheless less compact than the previous ones and requires an alignment between the three elements concerned, the laser diode 2, the coupling component and the optic adapting elements 28, sometimes formed by several lenses.

What is claimed is:

1. An integrated-optics coupling component, designed to adapt a light source to a guided optics element and comprising an optics substrate, wherein are formed waveguides and successively an input guide zone arranged facing the source, an output zone comprising at least one, monomode, output waveguide, narrower than the input guide zone, and filtering means comprising at least one adiabatic tapering zone connecting the input guide zone and the output zone, component characterized in that the input guide zone defines a diffraction zone of predetermined length between the input of the component and an observation plane, at least two filtering windows, arranged at predetermined locations of the observation plane, constituting the inputs of the adiabatic tapering zones, so as to guide a light wave from the source to the output zone while selecting one of the modes of said wave.

2. Component according to claim 1, characterized in that the length of the diffraction zone is greater than or equal to $L^2/4\lambda$, L being the width of the illuminated input guide zone and $\lambda$ the wavelength of the light emitted by the light source.

3. Component according to claim 2, wherein the length of the diffraction zone is greater than or equal to 2.5 mm.

4. Component according to claims 1, comprising two filtering windows, two adiabatic tapering zones connecting the input guide zone to two associated connecting waveguides, and a Y-junction connecting the connecting waveguides to the output waveguide.

5. Component according to claims 1, comprising four filtering windows and four adiabatic tapering zones connecting the input guide zone to four associated connecting waveguides, connected by means of a cascade of Y-junctions to the output waveguide.

6. Component according to claims 1, wherein reflecting means are associated with the output waveguide and the component is designed to cooperate with a transverse multimode light source comprising a reflecting rear face and an emitting face to form a transverse monomode power laser, the emitting face of the light source being treated so as to form an antiglare external face, so as to define an extended laser cavity oscillating on a single predetermined mode between said rear face and the reflecting means.

7. Component according to claim 6, wherein the reflecting means comprise a Bragg grating.

8. Component according to claim 6, wherein reflecting means comprise a reflecting layer arranged at an output end of the output zone.

9. Component according to claim 6, wherein the output waveguide presents at its output end a closed loop forming the reflecting means and ensuring feedback of the light on itself, by means of a Y-junction, a directional coupler associated to the closed loop forming the output of the coupling component.

10. Component according to claims 1, wherein the light source is a broad single-stripe laser diode and in that the input guide zone of the component has an input width greater than or equal to the width of the stripe.

11. Component according to claims 1, wherein the light source is a laser diode comprising a multi-stripe arrangement and in that the input guide zone of the component has an input width greater than or equal to the width of the multi-stripe arrangement.

12. Component according to claims 1, wherein the input guide zone comprises on input a waveguide with large light confinement in a direction perpendicular to the plane of the substrate.

13. Component according to claim 12, wherein the waveguide with large light confinement of the input zone is formed on the surface of the optics substrate and coupled with a second waveguide whereon it is superposed, the second waveguide being formed by ion exchange in the optics substrate and comprising a coupling part with large confinement and a low-confinement part constituting the output of the input zone.

14. Component according to claim 13, wherein coupling between the waveguide with large confinement of the input zone and the coupling part of the second waveguide is achieved by regular reduction of the thickness of the waveguide with large confinement.

15. Component according to claim 13, wherein coupling between the waveguide with large confinement of the input zone and the coupling part of the second waveguide is achieved by a Bragg grating, made at the surface of the substrate at the level of the coupling part of the second waveguide.

16. Monomode power laser comprising a multimode laser diode comprising an internal laser cavity bounded by a reflecting rear face and an emitting face, comprising a coupling component according to claims 1 and wherein the emitting face of the laser diode is treated so as to form an antiglare external face, so as to define an extended laser cavity between said rear face and reflecting means.

* * * * *